(12) United States Patent
Gosselin

(10) Patent No.: US 6,361,328 B1
(45) Date of Patent: Mar. 26, 2002

(54) SURFACE-MOUNTED LOW PROFILE CONNECTOR

(75) Inventor: Jacques Paul Gosselin, Paris (FR)

(73) Assignee: Framatome Connectors International, Courbevoie (FR)

( * ) Notice: Subject to any disclaimer, the term of this patent is extended or adjusted under 35 U.S.C. 154(b) by 0 days.

(21) Appl. No.: 09/628,207

(22) Filed: Jul. 28, 2000

(30) Foreign Application Priority Data

Aug. 3, 1999 (FR) .............................................. 99 10086

(51) Int. Cl.⁷ .............................................. H01R 12/00
(52) U.S. Cl. .............................. 439/78; 439/66; 439/83
(58) Field of Search ................ 439/78, 83, 66

(56) References Cited

U.S. PATENT DOCUMENTS

| | | | |
|---|---|---|---|
| 2,039,957 A | 5/1936 | Hall | 200/166 |
| 5,200,884 A | 4/1993 | Ohashi | 361/401 |
| 5,685,726 A | 11/1997 | Lwee et al. | 439/83 |
| 5,919,051 A | 7/1999 | Mitra | 439/74 |

FOREIGN PATENT DOCUMENTS

| | | |
|---|---|---|
| EP | 0731539 A2 | 9/1996 |
| FR | 1422508 | 1/1965 |
| FR | 2741201 | 5/1997 |

*Primary Examiner*—Khiem Nguyen
(74) *Attorney, Agent, or Firm*—Perman & Green, LLP

(57) ABSTRACT

A connector (1) designed to be surface-mounted on a printed board (2) so that a contact (5) of the connector is soldered on a first face (3) of the printed board and has a contact surface (16) on the side of a second face (4) of the printed board. A connector being such that the thickness (23) of the connector is of the same order as the one (9) of the printed board and provides a minimum thickness connection.

11 Claims, 2 Drawing Sheets

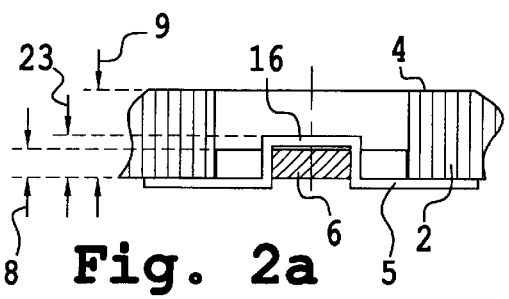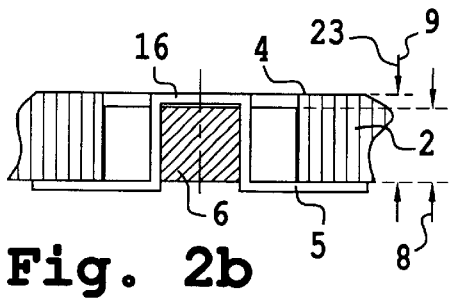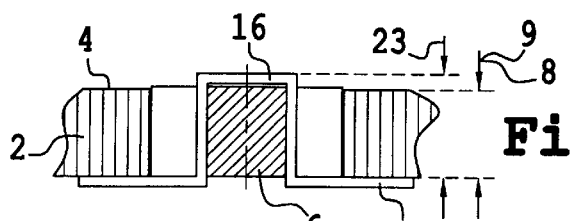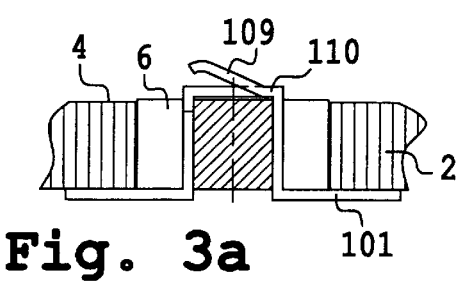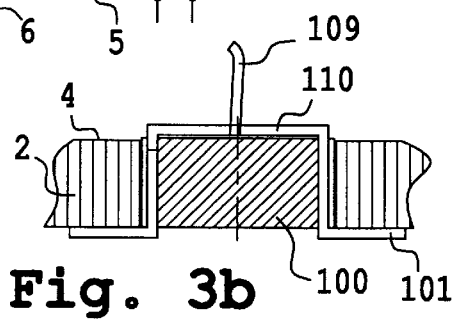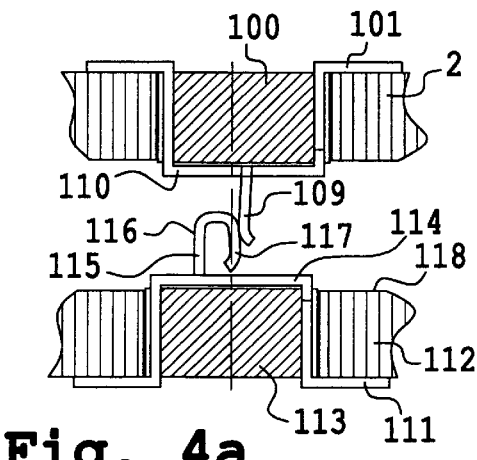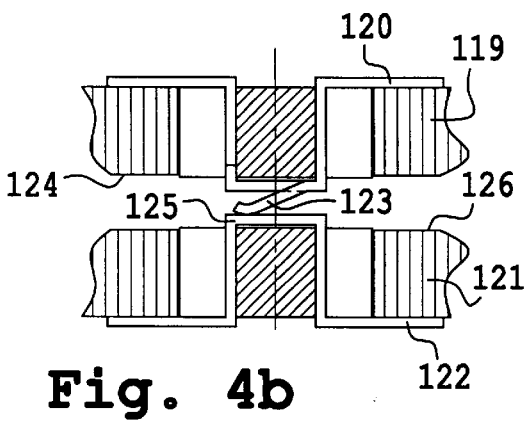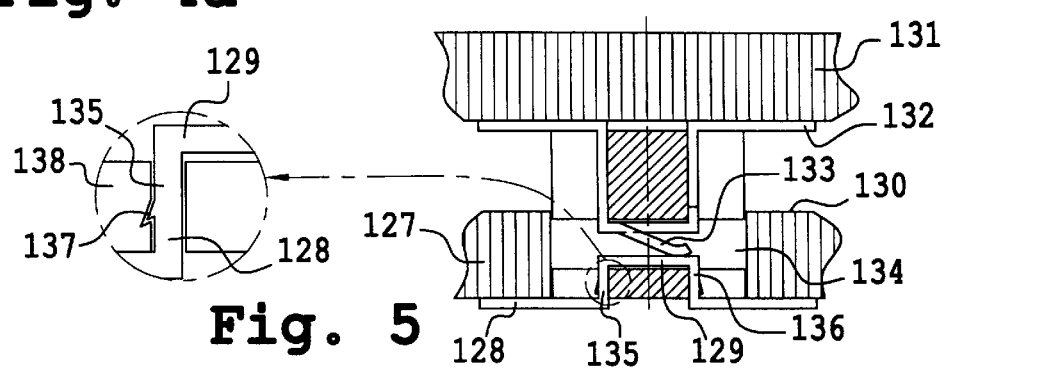

SURFACE-MOUNTED LOW PROFILE CONNECTOR

Figures 1A, 1B:
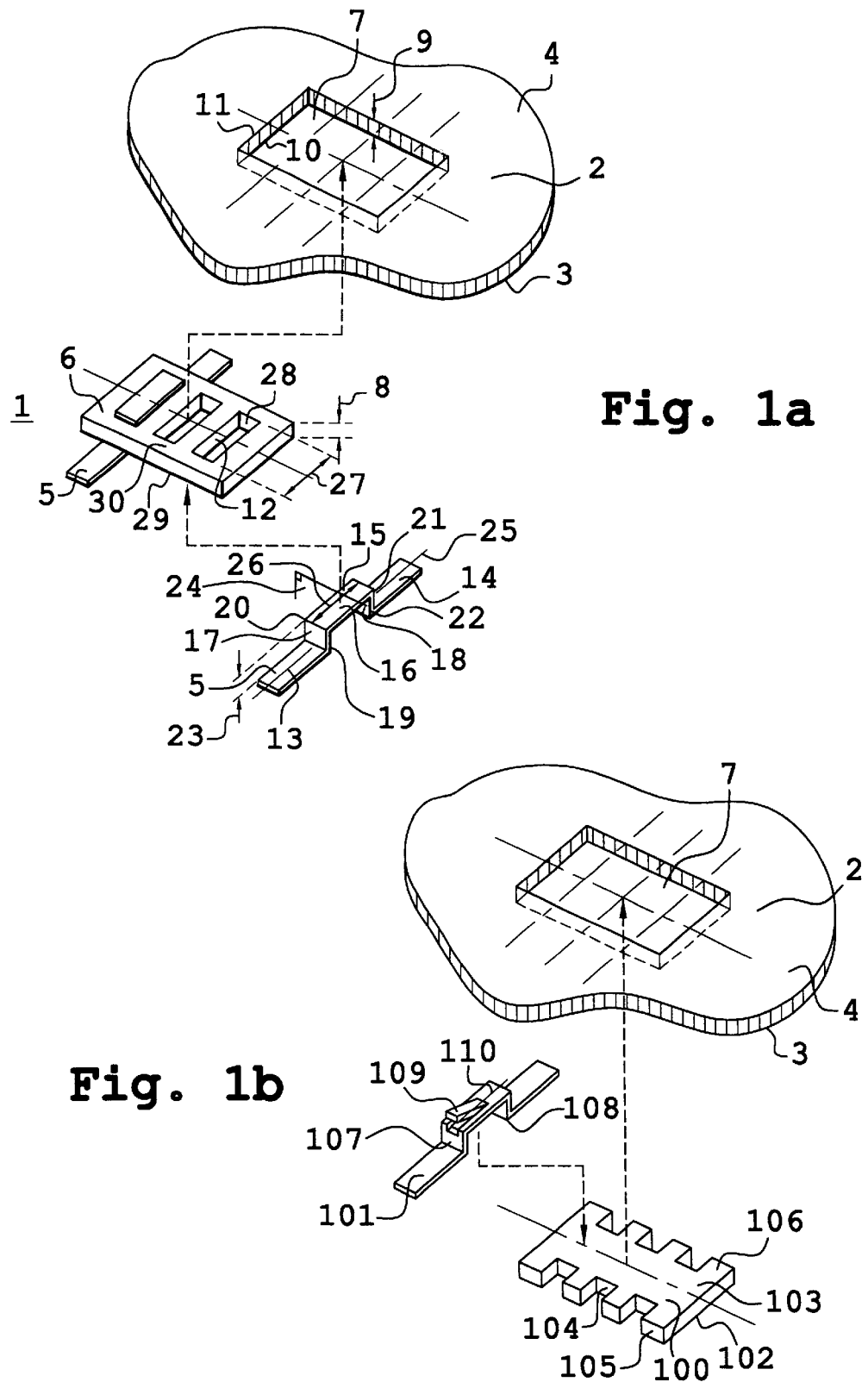

The present invention addresses a low profile connector designed for surface-mounting. It especially relates to connectors mounted in the thickness of a printed board. More particularly, it finds use in the field of miniature electronic devices. It may particularly be used in the field of mobile telephony, for instance for connection between a battery and a printed board housed in a case of a mobile phone. Such a connector may also be inserted in an opening of a printed circuit board, formed in the thickness thereof. The invention provides very low thickness and low profile connections, while preserving a high-quality electric contact.

In prior art, connectors to be surface-mounted and connected on a first face of a printed board are known. These connectors have a contact for connection to a complementary connector. The contact is situated on the side of said first face of the printed board. In this case, such surface-mounted prior art connector forms a protrusion on the surface of the printed board whereon it is mounted. Further, from document U.S. Pat. No. 5,685,726, a connector is known which comprises a plastic member and contacts housed in holes of said plastic member. Each contact is housed in a separate hole. The plastic member, in turn, is placed in an opening of a printed board so that tabs of the plastic member are mounted on a first face of the printed board and that a second face of said plastic member protrudes beyond the second side of the printed board. Also, the contacts housed in the holes of the plastic member are such that a portion of these contacts is soldered on the first face of the printed board, and such that they have a second portion which is perpendicular to the plane of the printed board, inside the respective holes of the plastic member. Such plastic member has orifices opening onto the second face of the printed board, so that the second vertical portion of the contacts is accessible for connection to a complementary connector. Therefore, the coupling area of this connector is situated in the hole of the plastic member.

Prior art connectors, while providing a high density, involve a first problem. These connectors are quite complex, a complex shape having to be provided if a coupling area wholly protected inside a plastic member is needed. As a result, the shape of the contacts inside the plastic member is complex. In fact, a contact comprises a metal section curved at several locations to allow it, on the one hand to be soldered on a face of the printed board, and on the other hand to be held inside the plastic member and finally to have a perpendicular portion of the contact for connection to a complementary connector. This structure is provided to allow several connection-disconnection cycles. Nevertheless, it has a drawback in its being rigid and also bulky. In fact, due to the structure of the contacts, the plastic member cannot be wholly housed within the thickness of the printed board. Further, the tabs of this plastic member protrude beyond a first side of the printed board. Prior art connectors have a second problem. They require a considerable force for inserting the complementary connector, which may eventually cause embrittlement of the printed board, of the plastic member or of the connection between said plastic member and the printed board.

A connector as provided in this invention also comprises a plastic member and a contact element. Such a connector is arranged to be mounted inside an opening of a printed board, whether said printed board is flexible or rigid. The contact is such that it has solder tails on a first face of the printed board. These solder tails are preferably soldered on both sides of the opening on the first face of the printed board. Further, the contact has a flat portion between these solder tails, said flat portion extending in the width of the opening, in such a manner as to have a contact surface on the side of the second face of the printed board. This flat surface is raised with respect to the solder tails, and is connected to said solder tails by vertical piers. These vertical piers have a height of the same order as the thickness of the printed board. The plastic member of such connector has a shape complementary to the opening of the printed board which may be already provided with contacts. Like the height of the piers, the plastic member has a thickness of the same order as the thickness of the printed board.

Said plastic member has at least one orifice wherefrom the flat surface appears on the side of the second face of the printed board. The vertical piers are preferably disposed along a wall of the plastic member in such a manner that said wall is perpendicular to a plane formed by the upper surface of the printed board. Hence, such a connector has a flat contact surface flush with or slightly above or below the surface of the second side of the printed board. Said flat surface may also include a contact element, itself being rigid or flexible, to ensure connection with a complementary connector. In a first illustrated instance, the flat surface of the contact has a length which is smaller than the width of the opening of the printed board, whereas the plastic member has a central orifice, so that the flat surface and the vertical lateral piers of the contact may be inserted therein. In a second illustrated instance, the flat contact surface has a length which is equal to the width of the opening of the printed board, whereas the plastic member has side indentations for the passage of the vertical lateral piers of the contact, upon mounting thereof in said opening of the printed board.

Thus, the invention relates to a connector to be surface-mounted on a printed board, comprising at least one contact and one insulating plastic member of said contact, the plastic member being held inside an opening of the printed board, the contact being mounted on a first face of the printed board and having a contact surface on the side of a second face of said printed board which is opposite to the first face, characterized in that the contact forms a bridge consisting of a central contact portion and two tabs, so that the two tabs are mounted against the first face of the printed board, the central contact portion extending in the opening between said two tabs.

The invention will be understood more clearly by reading the following description and by analyzing the accompanying figures. The latter are only shown by way of example and do not intend to limit the invention in any manner. The figures show:

FIG. 1a: a view of a connector according to the invention to be mounted in an orifice of a printed board;

FIG. 1b: a view of a variant of a connector according to the invention to be mounted in a printed board;

FIG. 2a: a section of a connector according to the invention mounted in a printed board;

FIG. 2b: a section of a variant of a connector according to the invention;

FIG. 2b: a section of a second variant of a

FIG. 2c: connector according to the invention;

FIG. 3a: a section of a third variant of a connector according to the invention;

FIG. 3b: a sectional view of a fourth variant of a connector according to the invention;

FIGS. 4a and 4b: sectional views of a connector assembly according to the invention;

FIG. 5: a sectional view of a connector according to the invention connected to a complementary connector.

FIG. 1a shows a connector 1 according to the invention. The connector 1 is to be surface-mounted, being disposed inside a cavity of a rigid or flexible substrate. In FIG. 1a, the connector 1 is surface-mounted on a rigid printed board 2. The connector 1 may as well be mounted on a flexible circuit board. The printed board 2 has a lower face 3 and an upper face 4, opposite to the lower face 3. The connector 1 is designed to be surface-mounted on the lower surface 3 The connector 1 comprises a contact 5 and a plastic member 6. The plastic member 6 has insulating properties. The contact 5 is made of an electrically conductive material. The plastic member 6 has a geometric shape complementary to an opening 7 of the printed board 2. Also, a thickness 8 of the plastic member 6 is of the same order as a thickness 9 of the printed board 2. In a preferred embodiment of the invention, the opening 7 has a first orifice 10 on the side of the lower face 3 and a second orifice 11 on the side of the upper face 4, so that the orifices 10 and 11 have identical, preferably rectangular, shapes. Thus, in this embodiment, the plastic member 6 has the shape of a parallelogram. The plastic member 6 may be inserted in the opening 7 from the lower face 3.

The plastic member 6 has a hole 12 for receiving a portion of the contact 5. The contact 5 has two tabs 13 and 14 situated on the same plane. The tabs 13 and 14 are interconnected by a central contact portion 15. The central contact portion 15 comprises a flat face 16 and two vertical lateral piers 17 and 18, connected to the tabs 13 and 14 respectively. The contact 5 is preferably made from an electrically conductive material, e.g. a metal foil. The contact 5 is easily obtained by cutting a preferably rectangular shape out of said metal foil, and by bending said metal foil at four locations, so that a bridgelike contact 5 is formed. In fact, the metal foil has a first, preferably substantially right-angled bend 19 between the tab 13 and the vertical pier 17. The contact 5 has a second, preferably substantially 90° bend, between the vertical pier 17 and the flat surface 16. Also, the contact has a third bend 21 between the flat surface 16 and the second vertical pier 18 and a fourth bend 22 between the second vertical pier 18 and the tab 14. The bends 19, 20, 21 and 22 preferably form 90° angles. Moreover, they are made in such a manner that the pier 17 has the same height 23 as the pier 18. In a preferred embodiment, the invention has a plane of symmetry 24. The plane of symmetry 24 is such that it is perpendicular to a main longitudinal axis 25 of the contact 5 and cuts the flat surface 16 at its center.

Along the main longitudinal axis 25, the flat surface 16 has a length 26. According to the FIG. 1a, but without limitation, the length 20 is slightly smaller than an opening width 27 of the hole 12. Hence, the hole 12 can receive the central contact portion 15. The lateral piers 17 and 18 come to contact with the walls 28 of the hole 12. The contact 5 is introduced in the hole 12 from a first side 29 of the plastic member 6 so that the contact surface 16 appears on a second side 30 of the plastic member 6, the second side 30 being opposite to 29. The contact 5 is introduced so that the tabs 13 and 14 abut against a face of the plastic member 6 on the side 29. Then, the tabs 13 and 14 are soldered on the lower face 3 of the printed board.

In FIG. 3a, in accordance with a variant of the invention as shown in FIG. 1b, the connector 1 has a plastic member 100 instead of the plastic member 6, for receiving a contact 101 instead of the contact 5. The plastic member 100 has a lower face 102 and an upper face 103. Further, the plastic member 100 has lateral indentations 104. The lateral indentations 104 are provided on a first side 105 and on a second side 106, the side 105 being opposite to the side 106. In this variant, the contact 101 is mounted on the plastic member 100 from the upper face 103. Also, the contact 101 is disposed on the plastic member 100 in such a manner that the lateral piers 107 and 108, like the piers 17 and 18, are placed against the walls 105 and 106 respectively, in coincidence with the indentations 104. The indentations 104 are deep enough to accommodate the lateral piers 107 and 108 upon insertion thereof in the opening 7 of the printed board 2. In accordance with this variant, the connector so formed is inserted from the lower face 3 of the printed board 2.

In FIG. 1a, the flat surface 16 connecting together the lateral piers 17 and 18 is a flat contact surface which, upon insertion thereof, is parallel to a plane formed by the upper face 4 of the printed board 2. FIGS. 2a, 2b, 2c show sectional views of several connectors of the invention, according to FIG. 1a. In FIG. 2a, a first arrangement of the invention is such that the thickness 8 of the plastic member 6 is smaller than the height 23 of the contact 5, the height 23 itself being smaller than the thickness 9 of the printed board 2. In this case, the contact surface 16 is situated within the thickness of the printed board 2. In FIG. 2b, the contact surface 16 is flush with the upper surface 4 of the printed board. According to this arrangement, the height 23 of the contact 5 is equal to the thickness 9 of the printed board. The thickness 8 of the plastic member is slightly smaller than the thickness of the printed board. Finally, in a further arrangement, as shown in FIG. 2c, the height 23 of the contact 5 is greater than the heights 8 and 9 of the plastic member 6 and of the printed board 2 respectively, the latter being identical. In this configuration, the contact surface 16 is provided slightly above the upper surface 4. These representations according to the invention are equally applicable to a contact 101 and to a plastic member 100 like those shown in FIG. 1b. In fact, a contact 101 supported by a plastic member 100, may have, depending on the thickness of the substrate, a contact surface slightly below or above or flush with the surface contact of the printed board.

In FIG. 1b, the contact 101 includes a blade 109. FIG. 3a shows a section of the plastic member 6 according to FIG. 1a, having a contact 101 like the one shown in FIG. 1b. The blade 109 stands on the surface 110. The blade 109 is cut out in the thickness of the flat surface 110. The blade 109 is flexible. It forms an angle 111 with respect to the plane formed by the flat surface 110. The blade 109 allows to make contact with a contact of a complementary connector. The elastic blade 109 exerts a normal contact force and ensures a proper and high quality connection with a complementary connector having a flat contact surface. FIG. 3b shows a section of a connector according to the invention, being mounted in a printed board 2 like the one shown in FIG. 1b. In this arrangement, the blade 109 stands perpendicularly to the contact surface 110 as well as to the upper surface 4.

FIG. 4a shows a connector assembly to be interconnected according to the invention, which provides a connection between the printed board 2 on the one hand, having a connector 101 of the invention with a blade 109 standing perpendicularly to the contact surface 110 and a second connector 111 according to the invention on the other hand, mounted in a printed board 112. The contact 111 is mounted in a plastic member 113. The plastic member 113 is like the one shown in FIG. 1b. The contact 111 also has a contact surface 114 with a blade 115. This blade 115 particularly has a trunk 116 and a flexible portion 117. The trunk 116 stands perpendicularly to an upper face 118 of the printed board 112. The flexible portion 117 is such that it is turned down parallel to the trunk 116. The contact between the printed boards 2 and 112 is ensured by a contact between the blade 109 and the flexible portion 117.

FIG. 4b shows a variant of a connector assembly according to the invention. FIG. 4b particularly shows a first printed board 119 fitted with a connector 120, the connector 120 being like the connector 101 of FIG. 3a, and a printed board 121 having a contact 122. The contact 122 is like the one shown in FIG. 2c. The circuit boards 119 and 121 are interconnected through the connectors 120 and 122. A blade 123 of the contact 120 slightly projects above an upper face 124 of the printed board 119. Also, the contact surface 125 of the contact 122 slightly projects above an upper face 126 of the printed board 121. In order to connect the circuit board 119 with the circuit board 121, the blade 123 is bent on the contact surface 125. Thus, the distance between the two printed boards 119 and 129 may be reduced to zero in certain instances.

In another embodiment of a connector according to the invention, a connector might only consist of a contact. In this arrangement, the printed board would include holes for the passage of the tabs of the contacts to be inserted, so that an end of these tabs could be soldered on a first face and that a contact surface could be situated on a second face of the printed board.

FIG. 5 shows an example of connection of a connector according to the invention with another connector. In fact, FIG. 5 shows a printed board 127 fitted with a contact 128, so that the contact surface 129 of the contact 128 is parallel to an upper face 130 of the printed board 127 and that said contact surface 129 is accommodated within the thickness of the printed board 127. The circuit board 127 is connected to another printed board 131 through another contact 132. The contact 132 is preferably surface-mounted. The contact 132 may have, for instance, a bridgelike shape, with a flexible blade on one end, which can abut against the contact surface 129. In this embodiment, the contact 132 penetrates the opening 134 of the printed board 127 containing the contact 128. Hence, even by only using one connector according to the invention, a low thickness connection may be obtained between two printed boards, or two other elements to be connected.

FIG. 5 shows a variant of the invention, in which the vertical piers 135 and 136 of the contact 128 have harpoons 137. A harpoon 137 allows to lock the contact 128 in an insulating plastic member 138 of the connector.

What is claimed is:

1. A connector (1) designed to be surface-mounted on a printed board (2), comprising at least one contact (5) and one insulating plastic member (6) of said contact, the plastic member being held inside an opening (7) of the printed board, the contact being mounted on a first face (3) of the printed board and having a contact surface (16) on the side of a second face (4) of said printed board which is opposite to the first face, characterized in that the contact forms a bridge consisting of a central contact portion (15) and two tabs (13, 14), so that the two tabs are mounted against the first face of the printed board, the central contact portion extending in the opening between said two tabs.

2. A connector as claimed in claim 1, characterized in that the central contact portion (15) has a flat contact surface parallel to a plane formed by the second face of the printed board.

3. A connector as claimed in one of claim 1, characterized in that the central contact portion (15) extends in a plane separate from the plane formed by the second face of the printed board.

4. A connector as claimed in claim 1, characterized in that the central contact portion includes a blade (109) which forms an angle with the second face of the board.

5. A connector as claimed in claim 4, characterized in that the blade is elastic and the angle is below 90°.

6. A connector as claimed in claim 4, characterized in that the blade is rigid (115) and has a trunk (116) which stands substantially perpendicularly to the second face (118) of the board.

7. A connector (1) designed to be surface-mounted on a printed board (2), comprising at least one contact (5) and one insulating plastic member (6) of said contact, the plastic member being held inside an opening (7) of the printed board, the contact being mounted on a first face (3) of the printed board and having a contact surface (16) on the side of a second face (4) of said printed board which is opposite to the first face, characterized in that the contact forms a bridge consisting of a central contact portion (15) and two tabs (13,14), so that the two tabs are mounted against the first face of the printed board, the central contact portion extending in the opening between said two tabs, further characterized in that the central contact portion includes a blade (109) which forms an angle with the second face of the printed board, further characterized in that the blade is rigid (115) and has a trunk (116) which stands substantially perpendicular to the second face (118) of the printed board, further characterized in that the blade has a flexible end (117), curved parallel to the trunk, and pointing towards the second face of the board.

8. A connector as claimed in one of claim 1, characterized in that the plastic member has a shape complementary to the opening and includes at least one hole (12) for insertion of the central contact portion of the contact.

9. A connector as claimed in one of claim 1, characterized in that the plastic member (100) has a shape complementary to the opening and includes lateral indentations (104) so that lateral piers of the contact, connecting the tabs of the contact to the contact surface may be placed in said indentations.

10. A connector assembly comprising two connectors to be interconnected as claimed in one of claim 1, characterized in that the two connectors are provided with complementary contacts (5, 101, 111).

11. A connector as claimed in claim 9, characterized in that the piers of the contact, between the central contact portion of the contact and the tabs of said contact have harpoons for locking the connector in the plastic member.

* * * * *